United States Patent [19]
Hah et al.

[11] Patent Number: 5,212,119
[45] Date of Patent: May 18, 1993

[54] METHOD FOR MAINTAINING THE RESISTANCE OF A HIGH RESISTIVE POLYSILICON LAYER FOR A SEMICONDUCTOR DEVICE

[75] Inventors: Hyung C. Hah, Kwangmyung-City; Jung T. Kim, Seoul; Yong K. Baek, Seoul; Hee K. Cheon, Seoul, all of Rep. of Korea

[73] Assignee: Hyundai Electronics Industries Co., Ltd., Rep. of Korea

[21] Appl. No.: 797,994

[22] Filed: Nov. 26, 1991

[30] Foreign Application Priority Data

Nov. 28, 1990 [KR] Rep. of Korea ............... 90-19326

[51] Int. Cl.$^5$ ............... H01L 21/00; H01L 21/02; H01L 21/469
[52] U.S. Cl. .................... 437/235; 437/233; 437/238; 437/241; 437/247; 148/DIG. 3; 148/DIG. 118; 148/DIG. 122
[58] Field of Search ............ 437/225, 228, 233, 235, 437/238, 241, 247, 248; 148/DIG. 3, DIG. 118, DIG. 122

[56] References Cited

U.S. PATENT DOCUMENTS

| | | | |
|---|---|---|---|
| 4,742,020 | 5/1988 | Roy | 437/235 |
| 4,774,202 | 9/1988 | Pan et al. | 437/233 |
| 4,882,299 | 11/1989 | Freeman et al. | 437/233 |
| 4,897,360 | 1/1990 | Guckel et al. | 437/233 |
| 4,950,624 | 8/1990 | Inuzima et al. | 437/235 |
| 4,980,307 | 12/1990 | Ito et al. | 437/235 |
| 4,981,811 | 1/1991 | Feygenson et al. | 437/233 |

FOREIGN PATENT DOCUMENTS

| | | | |
|---|---|---|---|
| 0001237 | 1/1987 | Japan | 437/233 |
| 0060038 | 3/1991 | Japan | 437/233 |
| 0203329 | 9/1991 | Japan | 437/235 |
| 0039931 | 2/1992 | Japan | 437/235 |
| 0096216 | 3/1992 | Japan | 437/233 |

*Primary Examiner*—Brian E. Hearn
*Assistant Examiner*—B. Everhart
*Attorney, Agent, or Firm*—Ladas & Parry

[57] ABSTRACT

A method for depositing a passivation layer on a semiconductor structure having a high resistance value polysilicon layer formed thereon while maintaining the high resistance value thereof and comprises sequentially depositing a silicon oxide layer and a silicon nitride layer, on a high resistance value polysilicon layer of a partially completed semiconductor structure to form a passivation layer thereover. The passivation layer including the silicon oxide layer and the silicon nitride layer is annealed with oxygen plasma in a chamber. The annealed passivation layer is then heated in the presence of a conditioning gas in the chamber to thereby maintaining the resistance of the high resistance value polysilicon layer.

20 Claims, 1 Drawing Sheet

METHOD FOR MAINTAINING THE RESISTANCE OF A HIGH RESISTIVE POLYSILICON LAYER FOR A SEMICONDUCTOR DEVICE

BACKGROUND OF INVENTION

1. Field of the Invention

The invention relates to a method for preventing the loss of resistance in a high resistance polysilicon layer resulting from depositing a passivation layer thereover, and more particularly, to a method for maintaining the resistance of the high resistive polysilicon layer to a predetermined level by discharging a plurality of ions or electrons from the high resistive polysilicon layer by performing an annealing process with oxygen plasma and a heat treatment process with nitrogen conditioning gas on a passivation layer deposited on the structure having the high resistive polysilicon layer.

2. Information Disclosure Statement

Generally, in order to increase the resistance of the high resistive polysilicon layer, a method for decreasing the thickness of the polysilicon layer and a method for implanting impurities of As or P into the polysilicon layer, as much as $10^{12}-10^{14}/cm^2$, have been suggested.

However, according to the prior art method, when depositing the passivation layer on the high resistive polysilicon layer of a partially completed semiconductor structure by using a plasma-enhanced chemical vapor deposition process, the plurality of ions or electrons are driven into the high resistive polysilicon layer through a metal layer or a silicon layer positioned as being associated with the polysilicon layer, so that they are trapped into the boundary of the grains of the polysilicon layer, thereby greatly decreasing the resistance of the underlying polysilicon layer.

Therefore, in order to avoid the above mentioned problem, a method has been suggested to maintain the resistance of the polysilicon layer by depositing a silicon nitride Si N layer on the polysilicon layer utilizing a chemical evaporation process. However, according to the process described above, a problem remains in that several additional processes are required. Here, it should be noted that in depositing the passivation layer hydrogen ions occur as a by-product which cannot be avoided during the manufacturing process and which undesirably effect the resistance value of the high resistive polysilicon layer.

Accordingly, it is an object of the present invention to solve the problems set forth above and to provide a method for preventing the resistance of a high resistive polysilicon layer from decreasing due to the deposition of the passivation layer by annealing the passivation layer with oxygen plasma and heating the same with nitrogen conditioning gas to discharge the ions trapped into the boundary of the plurality of the grains in the polysilicon layer.

It is a further object of the present invention to provide a process for preventing the loss of resistance for a high resistive polysilicon layer due to the plurality of ions or electrons trapped into the boundary of the grains of the high resistive polysilicon layer during the depositing process of the passivation layer on the high resistive polysilicon layer.

The preceding objects should be construed as merely presenting a few of the more pertinent features and applications of the invention. Many other beneficial results can be obtained by applying the disclosed invention in a different manner or modifying the invention within the scope of the disclosure. Accordingly, other objects and a fuller understanding of the invention may be had by referring to both the summary of the invention and the detailed description, below, which describe the preferred embodiment in addition to the scope of the invention defined by the claims considered in conjunction with the accompanying drawings.

SUMMARY OF THE INVENTION

The method for maintaining the resistance of a polysilicon layer after the formation of a passivation layer thereon according to the present invention is defined by the claims with a specific embodiment shown in the attached drawings. For the purpose of summarizing the invention, the invention relates to a method for depositing a passivation layer on a semiconductor structure having a high resistance value polysilicon layer formed thereon while maintaining the high resistance value thereof, the method comprising sequentially depositing a silicon oxide layer and a silicon nitride layer, on the high resistance value polysilicon layer of a partially completed semiconductor structure to form a passivation layer on the polysilicon layer. The passivation layer, which includes the silicon oxide layer and the silicon nitride layer, is then annealed with oxygen plasma in a chamber. The annealed passivation layer is then heated in the presence of a conditioning gas, preferably nitrogen, in the chamber thereby maintaining the resistance of the high resistance value polysilicon layer.

The silicon oxide layer and the silicon nitride layer are each preferably deposited utilizing a plasma-enhanced chemical vapor deposition process.

The passivation layer is annealed at a temperature of 300-400 degrees Celsius for a period of 1-2 minutes in a chamber in the presence of oxygen plasm and which preferably includes the simultaneous application of a radio frequency of 13.56 MHZ into the chamber and supplying 500-1,000 SCCM of oxygen and 300-500 Watts of power to the chamber to produce the oxygen plasma.

The annealed passivation layer is then preferably heated in the presence of a nitrogen conditioning gas at a temperature of 350-450 degrees Celsius for a period of 30-60 minutes in the chamber.

A second embodiment of the present invention includes a method for depositing a passivation layer on a semiconductor structure having a high resistance value polysilicon layer formed thereon while maintaining the high resistance value thereof in a two step manner comprising depositing a silicon oxide layer on the high resistant polysilicon layer to a predetermined thickness. The silicon oxide layer is annealed by oxygen plasma and heat treated with nitrogen conditioning gas in a chamber. A silicon nitride layer is deposited on the annealed silicon oxide layer. The silicon nitride layer is annealed by treatment with oxygen plasma and heat treated with nitrogen conditioning gas in the chamber to form a resulting passivation layer thereby maintaining the high resistance of the high resistant polysilicon layer.

The silicon oxide layer and the silicon nitride layer are each preferably deposited utilizing a plasma-enhanced chemical vapor deposition process.

The silicon oxide layer and the silicon nitride layer are annealed at a temperature of 300-400 degrees Celsius for a period of 1-2 minutes in a chamber in the presence of oxygen plasma preferably with the simultaneous application of a radio frequency of 13.56 MHZ into the chamber and supplying 500-1,000 SCCM of oxygen and 300-500 Watts of power to the chamber to produce oxygen plasma.

The annealed silicon oxide layer and the annealed silicon nitride layer are each heated in the presence of a nitrogen conditioning gas at a temperature of 350-450 degrees Celsius for a period of 30-60 minutes in the chamber.

The more pertinent and important features of the present invention have been outlined above in order that the detailed description of the invention which follows will be better understood and that the present contribution to the art can be fully appreciated. Additional features of the invention described hereinafter form the subject of the claims of the invention. Those skilled in the art can appreciate that the conception and the specific embodiment disclosed herein may be readily utilized as a basis for modifying or designing other structures for carrying out the same purposes of the present invention. Further, those skilled in the art can realize that such equivalent constructions do not depart from the spirit and scope of the invention as set forth in the claims.

BRIEF DESCRIPTION OF THE DRAWINGS

For fuller understanding of the nature and objects of the invention, reference should be had to the following detailed description taken in conjunction with the accompanying drawings in which.

DETAILED DESCRIPTION OF THE INVENTION

Figure 1:
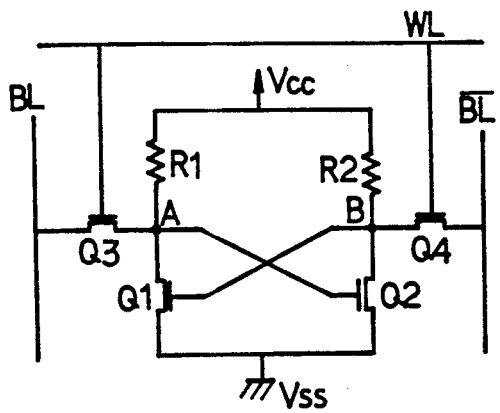
FIG. 1 illustrates a circuit of the static RAM which uses a polysilicon layer having a resistance above 1 tera ohm.

FIG. 1 illustrates the equivalent circuit of the static RAM used in general, in which a pair of high resistive resistors R1, R2 and a pair of MOS transistors Q1, Q2 are connected between a power voltage Vcc and a ground Vss. Each connection point A,B between the high resistances R1, R2 and the MOS transistors Q1, Q2 is cross connected to each gate of MOS transistors Q2, Q1. MOS transistors Q3, Q4 of which each gate is connected to a word line WL are connected between the bit line BL and the point A, and between the point B and the bit line $\overline{BL}$ respectively. In the above mentioned static RAM, a polysilicon layer having a resistance above 1 tera ohms ($\Omega$) is generally used. Here, the voltage applied to the connection points A, B of the high resistive resistor R1. R2 consisting of the polysilicon has a role to compensate for the leak current directed to the MOS transistors Q1, Q2, Q3, Q4. Furthermore, as the integrity of the memory increases, a high resistance polysilicon layer is desired.

For manufacturing the static RAM, it is assumed that MOS transistors Q1, Q2, Q3, Q4 are formed on the semiconductor substrate (not shown) by well known technology, the high resistive polysilicon layer for forming the high resistive resistors R1 and R2 is then formed thereon, respectively, and the oxide layer or BPSG (Boro-Phosphorus-Silica-Glass) layer, metal wired layer for word line and passivation layer are formed sequentially. At this time, the passivation layer is formed thereover by depositing the oxide layer and the nitride layer as much as 1 micrometer using a plasma-enhanced chemical vapor deposition process. Here, a plurality of ions in the plasma state are directed to the underlying high resistive polysilicon layer and are trapped into the boundary of a plurality of grains of the polysilicon layer. Thus, the resistance value of the high resistive polysilicon layer is largely decreased so that the resistance value of the load resistor used in the high integrated semiconductor device of the static RAM above the mega bit is not satisfied.

It should be noted that the above mentioned process for manufacturing the static RAM is well known in the art that only an abbreviated version is set forth herein for the sake of brevity.

According to the first embodiment of the present invention, in order to avoid the problem mentioned above, a silicon oxide layer and a silicon nitride layer, which form a passivation layer, is deposited to a thickness of 1 micrometer on the partially completed semiconductor structure including a high resistive polysilicon layer by utilizing a plasma-enhanced chemical vapor deposition process. The passivation layer including the silicon oxide layer and the silicon nitride layer is then annealed with oxygen plasma at a temperature of 300-400 degrees Celsius for a period of 1-2 minutes in a chamber, not shown, by applying 13.56 MHZ of radio frequency into the chamber having predetermined conditions, for example, 500-1,000 SCCM of oxygen and 300-500 Watts of power, in order to produce oxygen plasma. The resulting annealed passivation layer is then heated in the presence of nitrogen conditioning gas at a temperature of 350-450 degrees Celsius for a period of 30-60 minutes in the chamber so that the hydrogen ions trapped in the boundary of the plurality of the grains in the polysilicon layer during the deposition of the passivation layer are discharged through the adjacent layers, for example, oxide silicon layer or BPSG layer which may be positioned as being associated with the polysilicon layer to maintain the inherent resistance of the high resistive polysilicon layer.

Figure 2:
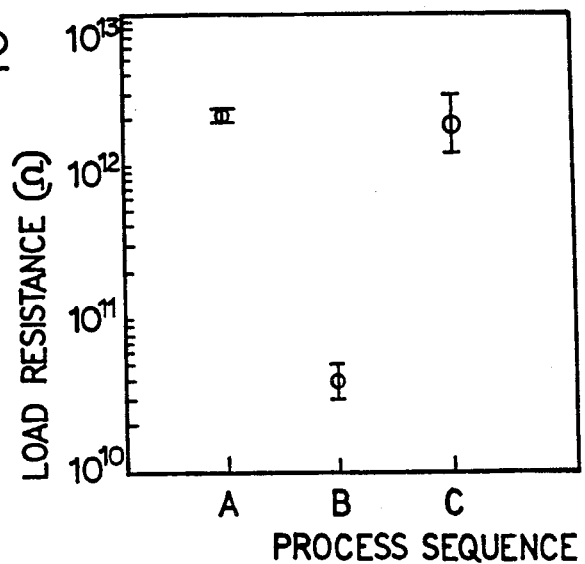
FIG. 2 is a graphic comparison of the load resistance values of the high resistive polysilicon layer according to the first embodiment of the present invention.

FIG. 2 illustrates a graph to represent the load resistance values of the high resistive polysilicon layer according to the first embodiment of the present invention in which the A-process sequence shows the resistance value of the high resistive polysilicon layer before the passivation layer is deposited thereon. The B-process sequence shows the resistance value thereof after the passivation layer consisting of the silicon oxide layer and silicon nitride layer is deposited thereon. The C-process sequence shows the resistance value thereof after the annealing process of oxygen plasma and the heat treatment with nitrogen conditioning gas is performed to the passivation layer according to the present invention.

According to the prior art method, the resulting resistance of the polysilicon layer is instantaneously deceased as shown in comparing the results of the A-process sequence and B-process sequence. However it can be seen that if the process according to the present invention is applied thereto, the resulting resistance value of the polysilicon layer is desirably retained as shown in C-process sequence of FIG. 2.

The second embodiment of the present invention for maintaining the resistance value of the polysilicon layer comprises a method to combine the annealing process of oxygen plasma and the heat treatment of the nitrogen conditioning gas applied to the passivation layer. That is, in order to form the passivation layer, a silicon oxide layer is first deposited on the intended semiconductor structure, on which the polysilicon layer is formed, to a predetermined thickness. An annealing process of oxygen plasma and heat treatment with nitrogen conditioning gas are respectively performed to the silicon oxide layer in the chamber under conditions which are the same conditions used in the first embodiment of the invention as described hereinbefore. A silicon nitride layer is then deposited on the annealed silicon oxide layer, and the annealing process of oxygen plasma and a heat treatment with nitrogen conditioning gas are also performed to the silicon nitride layer in the chamber under the same conditions as mentioned above, thereby forming a resulting passivation layer which includes the silicon nitride layer and the silicon oxide layer.

According to the second embodiment of the invention mentioned above, the inherent resistance of the high resistive polysilicon layer can be maintained without the problems as mentioned in connection with the prior art method.

Figure 3:
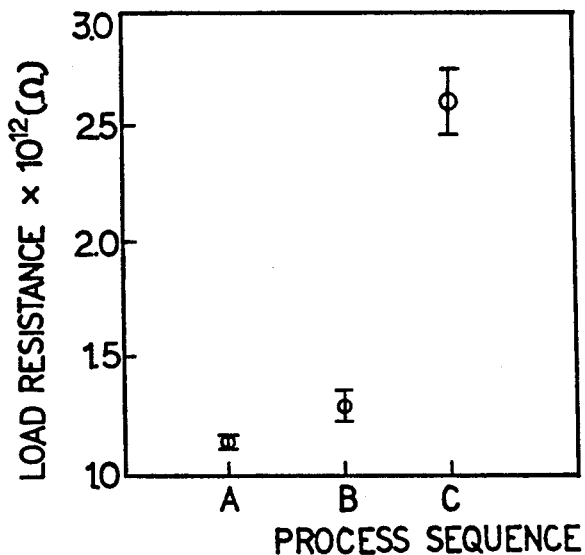
FIG. 3 is a graphic comparison of the load resistance values of the high resistive polysilicon layer according to the second embodiment of the invention.

FIG. 3 illustrates a graph for representing the load resistance values of the high resistive polysilicon layer according to the second embodiment of the invention, in which the A-process sequence shows the resistance value of the high resistive polysilicon layer before any passivation layer is deposited thereon. The B-process sequence shows the resistance value thereof after the silicon oxide layer is deposited, and the annealing process of oxygen plasma and the heat treatment with nitrogen conditioning gas are performed thereto, respectively. The C-process sequence shows the resistance value thereof after the silicon nitride layer is deposited on the annealed silicon oxide layer, and the annealing process of oxygen plasma and heat treatment with nitrogen conditioning gas are performed thereto, respectively. Referring to the graph, it can be appreciated that the load resistance value of the high resistive polysilicon layer is gradually increased from the A-process sequence which is the step before the passivation layer is deposited thereon, through the B-process sequence to the C-process sequence, which are the steps according to the second embodiment of the invention.

As described above, according to the present invention, it can prevent the loss of the resistance of the high resistive polysilicon layer due to the deposition of the passivation layer thereon so that the characteristics of the resulting semiconductor device is improved. It is noted that although the invention has been described in connection with the high resistive polysilicon layer applied to the static RAM (SRAM), it can be applied to any type of the semiconductor device which employs the high resistive polysilicon layer.

Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the spirit and scope of the invention.

What is claimed is:

1. A method for preventing the resistance of a high resistive polysilicon layer from decreasing due to the deposition of a passivation layer on the partially completed semiconductor structure which includes the high resistive polysilicon layer in a semiconductor device, the method comprising:

depositing a passivation layer including a silicon oxide layer and a silicon nitride layer on a high resistive polysilicon layer of the partially completed semiconductor structure, by utilizing a plasma-enhanced chemical vapor deposition process;

annealing the passivation layer with oxygen plasma in a chamber; and heating the annealed passivation layer in the presence of nitrogen conditioning gas in the chamber such that it prevents the resistance of the high resistive polysilicon layer from being decreased by out-diffusing a plurality of the ions trapped into the boundary of the grains of the high resistive polysilicon during the deposition process of the passivation layer.

2. The method of claim 1 wherein the passivation layer is annealed at a temperature of 300–400 degrees Celsius for a period of 1–2 minutes in a chamber in the presence of oxygen plasma.

3. The method of claim 2 further including the simultaneously application of a radio frequency of 13.56 MHZ into the chamber and supplying 500–1,000 SCCM of oxygen and 300–500 Watts of power to the chamber to produce the oxygen plasma.

4. The method of claim 1 wherein the annealed passivation layer is heated in the presence of the nitrogen conditioning gas at a temperature of 350–450 degrees Celsius for a period of 30–60 minutes in the chamber.

5. A method for preventing the resistance of a high resistive polysilicon layer from decreasing due to the deposition of the passivation layer on the partially completed semiconductor structure including the high resistive polysilicon layer in a semiconductor device, the method comprising:

depositing a silicon oxide layer on a high resistive polysilicon layer of the partially completed semiconductor structure, by utilizing a plasma-enhanced chemical vapor deposition process;

annealing the silicon oxide layer with oxygen plasma in a chamber;

heating the annealed silicon oxide layer in the presence of nitrogen conditioning gas in the chamber;

depositing a silicon nitride layer on the resulting silicon oxide layer, by utilizing a plasma-enhanced chemical vapor deposition process;

annealing the silicon nitride layer with oxygen plasma in a chamber; and heating the annealed silicon nitride layer in the presence of nitrogen conditioning gas in the chamber, to thereby form a passivation layer including the silicon oxide layer and silicon nitride layer, such that it prevents the resistance of the high resistive polysilicon layer from being decreased by out-diffusing a plurality of the ions trapped into the boundary of the grains of the high resistive polysilicon during the deposition process of the passivation layer.

6. The method of claim 5 wherein the passivation layer is annealed at a temperature of 300–400 degrees Celsius for a period of 1–2 minutes in a chamber in the presence of oxygen plasma.

7. The method of claim 6 further including the simultaneous application of a radio frequency of 13.56 MHZ into the chamber and supplying 500–1,000 SCCM of oxygen and 300–500 Watts of power to the chamber to produce the oxygen plasma.

8. The method of claim 5 wherein the annealed passivation layer is heated in the presence of the nitrogen conditioning gas at a temperature of 350–450 degrees Celsius for a period of 30–60 minutes in the chamber.

9. A method for depositing a passivation layer on a semiconductor structure having a high resistance value polysilicon layer formed thereon while maintaining the high resistance value thereof, the method comprising:
sequentially depositing a silicon oxide layer and a silicon nitride layer, on the high resistance value polysilicon layer of a partially completed semiconductor structure to form a passivation layer thereon;
annealing the passivation layer including the silicon oxide layer and the silicon nitride layer with oxygen plasma in a chamber; and
heating the annealed passivation layer in the presence of a conditioning gas in the chamber thereby maintaining the resistance of the high resistance value polysilicon layer.

10. The method of claim 9 wherein the silicon oxide layer and the silicon nitride layer are deposited utilizing a plasma-enhanced chemical vapor deposition process.

11. The method of claim 9 wherein the passivation layer is annealed at a temperature of 300–400 degrees Celsius for a period of 1–2 minutes in a chamber in the presence of oxygen plasma.

12. The method of claim 11 further including applying 13.56 MHZ radio frequency into the chamber and supplying 500–1,000 SCCM of oxygen and 300–500 Watts of power to the chamber to produce oxygen plasma.

13. The method of claim 9 wherein the annealed passivation layer is heated in the presence of a nitrogen conditioning gas at a temperature of 350–450 degrees Celsius for a period of 30–60 minutes in the chamber.

14. A method for depositing a passivation layer on a semiconductor structure having a high resistance value polysilicon layer formed thereon while maintaining the high resistance value thereof, the method comprising:
depositing a silicon oxide layer and a silicon nitride layer, on the high resistance polysilicon layer by a plasma-enhanced chemical vapor deposition process to form a passivation layer on the semiconductor structure;
annealing the passivation layer including the silicon oxide layer and the silicon nitride layer at a temperature of 300–400 degrees Celsius for a period of 1–2 minutes in a chamber in the and simultaneously applying 13.56 MHZ radio frequency into the chamber and supplying 500–1,000 SCCM of oxygen and 300–500 Watts of power to the chamber to produce oxygen plasma; and
heating the annealed passivation layer in the presence of a nitrogen conditioning gas at a temperature of 350–450 degrees Celsius for a period of 30–60 minutes in the chamber thereby maintaining the resistance of the high resistant polysilicon layer.

15. A method for depositing a passivation layer on a semiconductor structure having a high resistance value polysilicon layer formed thereon while maintaining the high resistance value thereof, the method comprising:
depositing a silicon oxide layer on the high resistant polysilicon layer;
annealing the silicon oxide layer with oxygen plasma;
heat treating the annealed silicon oxide layer with nitrogen conditioning gas in a chamber;
depositing a silicon nitride layer on the annealed silicon oxide layer;
annealing the silicon nitride layer by treatment with oxygen plasma; and
heat treating the annealed silicon nitride layer with nitrogen conditioning gas in the chamber to form a resulting passivation layer thereby maintaining the high resistance of the high resistant polysilicon layer.

16. The method of claim 15 wherein the silicon oxide layer and the silicon nitride layer are each deposited utilizing a plasma-enhanced chemical vapor deposition process.

17. The method of claim 15 wherein the silicon oxide layer and the silicon nitride layer are annealed at a temperature of 300–400 degrees Celsius for a period of 1–2 minutes in a chamber in the presence of oxygen plasma.

18. The method of claim 17 wherein the oxygen plasma is formed in the chamber and simultaneously applying 13.56 MHZ radio frequency into the chamber and supplying 500–1,000 SCCM of oxygen and 300–500 Watts of power to the chamber to produce oxygen plasma.

19. The method of claim 15 wherein the annealed silicon oxide layer and the annealed silicon nitride layer are each heated in the presence of a nitrogen conditioning gas at a temperature of 350–450 degrees Celsius for a period of 30–60 minutes in the chamber.

20. A method for depositing a passivation layer on a semiconductor structure having a high resistance value polysilicon layer formed thereon while maintaining the high resistance value thereof, the method comprising:
depositing a silicon oxide layer on the high resistant polysilicon layer to a predetermined thickness by a plasma-enhanced chemical vapor deposition process;
annealing the silicon oxide layer at a temperature of 300–400 degrees Celsius for a period of 1–2 minutes in a chamber in the and simultaneously applying 13.56 MHZ radio frequency into the chamber and supplying 500–1,000 SCCM of oxygen and 300–500 Watts of power to the chamber to produce oxygen plasma:
heating the annealed silicon oxide layer in the presence of a nitrogen conditioning gas at a temperature of 350–450 degrees Celsius for a period of 30–60 minutes in the chamber;
depositing a silicon nitride layer on the annealed silicon oxide layer by a plasma-enhanced chemical vapor deposition process;
annealing the silicon nitride layer at a temperature of 300–400 degrees Celsius for a period of 1–2 minutes in the chamber in the and simultaneously applying 13.56 MHZ radio frequency into the chamber and supplying 500–1,000 SCCM of oxygen and 300–500 Watts of power to the chamber to produce oxygen plasma thereby forming a resulting passivation layer; and
heating the annealed silicon nitride layer in the presence of a nitrogen conditioning gas at a temperature of 350–450 degrees Celsius for a period of 30–60 minutes in the chamber thereby maintaining the high resistance of the high resistant polysilicon layer.

* * * * *